United States Patent [19]

Matthews

[11] Patent Number: 6,037,877
[45] Date of Patent: Mar. 14, 2000

[54] CHANNEL NUMBER ORGANIZER

[76] Inventor: Carl G. Matthews, 3544 Bell, Kansas City, Mo. 64111

[21] Appl. No.: 09/021,891

[22] Filed: Feb. 11, 1998

[51] Int. Cl.$^7$ ................................................ H01H 67/00
[52] U.S. Cl. ............................... 340/825.03; 340/825.69; 340/825.72
[58] Field of Search ..................... 340/825.03, 825.69, 340/825.72, 825.31, 825.34; 341/22, 23, 28, 176; 348/734, 586, 563, 569, 570

[56] References Cited

U.S. PATENT DOCUMENTS 4,853,878  8/1989  Brown ........................... 341/28
5,673,089  9/1997  Yuen et al. ..................... 348/734

*Primary Examiner*—Michael Tokar
*Assistant Examiner*—Jean B. Jeanglaude
*Attorney, Agent, or Firm*—Hovey, Williams, Timmons & Collins

[57] ABSTRACT

A channel organizer enables the user of a television remote control (10) using the channel up and channel down functions to define a scrolling loop of selected channels as a subset of the available channels. By entering a loop designation, scrolling is enabled on the television (12) only for those channels included in the subset, thereby skipping unwanted channels, and positioning channel numbers with or without regard to numerical sequence order.

2 Claims, 1 Drawing Sheet

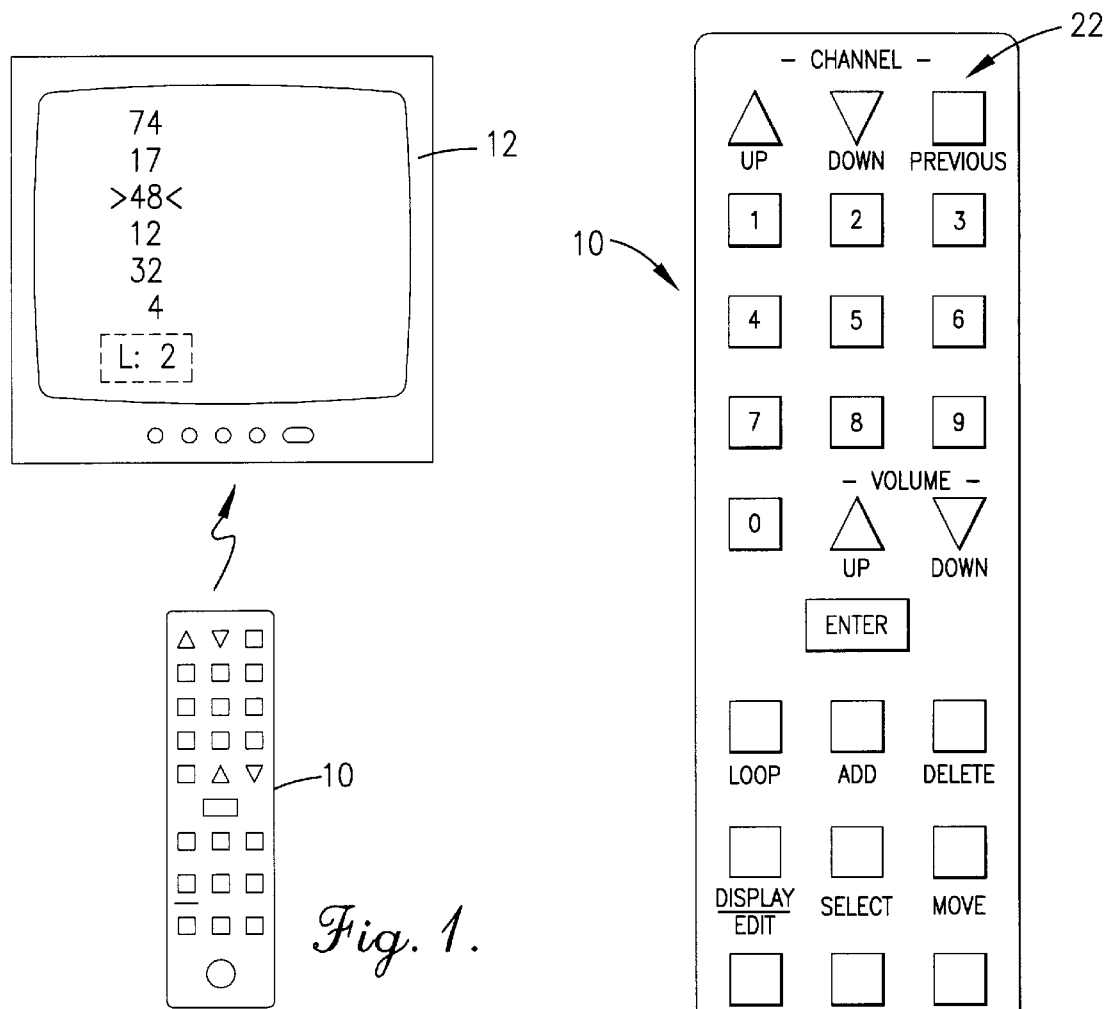
Fig. 3.
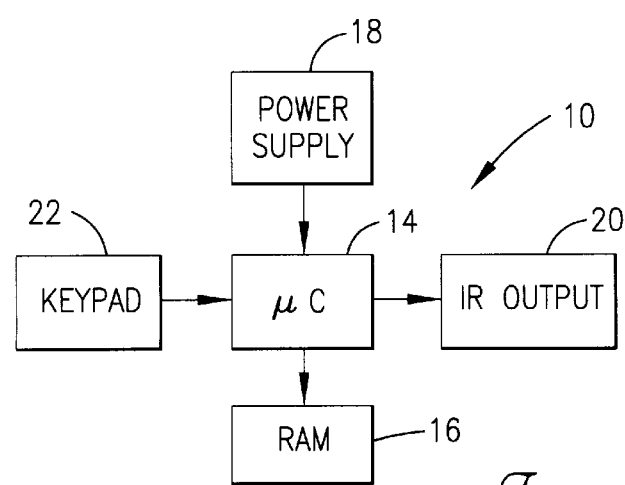
Fig. 1.
Fig. 2.

CHANNEL NUMBER ORGANIZER

RELATED APPLICATIONS

Not applicable.

FEDERALLY SPONSORED RESEARCH OR DEVELOPMENT

Not applicable.

MICROFICHE APPENDIX

Not applicable.

BACKGROUND OF THE INVENTION

1. Field of the Invention

The present invention relates to the field of television channel selection control. More particularly, the invention is concerned with a channel organizer system that enables the user of a television remote control using the channel up and channel down functions to define a scrolling loop of selected channels as a subset of the available channels. By entering a loop designation, scrolling is enabled only for those channels included in the subset, thereby skipping unwanted channels.

2. Description of the Prior Art

A typical television remote control includes keys for channel up and channel down functions. By activating one of these keys, the television scrolls through the various channels in sequence.

Some cable television systems provide thirty or more channels and satellite systems often provide more than a hundred channels. Scrolling through this many channels can be time-consuming and inefficient for a viewer who wishes to scroll through the channels in order to find a program of interest.

SUMMARY OF THE INVENTION

The present invention solves the prior art problem discussed above and provides a distinct advance in the state of the art. In particular, the channel organizer hereof enables a viewer to define those channels of interest as a subset of the available channels and scroll through this subset in a time efficient manner.

The preferred channel organizer apparatus of the present invention includes a memory device coupled with a controller responsive to keypad entries on a remote control. In the preferred embodiment, the apparatus is incorporated as part of the remote control.

In operation according to the preferred method of the present invention, a loop designation is received by way of a keypad and represents a designated scrolling loop, with loop data representative thereof stored in the memory device. Also, channel designations are received by way of the keypad and represent a subset of the total number of channels available, with channel data representative thereof also stored in the memory device in association with the loop data.

In response to entry of the loop designation, the loop and channel data are retrieved from the memory device. Scrolling is enabled using the channel up and down keys only for those channels included in the subset thereby skipping those unwanted channels outside the subset. In preferred forms, a plurality of different scrolling loops may be defined each with a customized subset of the available channels. Other preferred aspects of the present invention are disclosed herein.

BRIEF DESCRIPTION OF THE DRAWINGS

FIG. 1 is a schematic representation of a television remote control incorporating the preferred channel organizer apparatus of the present invention in use for controlling the channel selection of a television;

FIG. 2 is an electrical block diagram of the remote control of FIG. 1; and

FIG. 3 is a plan view of the remote control and keypad of FIG. 2.

DETAILED DESCRIPTION OF THE PREFERRED EMBODIMENT

FIG. 1 illustrates remote control 10 in accordance with the present invention shown in use with a receiver in the nature of television 12. It will be appreciated that the present invention encompasses receivers of other types operable for presenting a plurality of channels including a video cassette recorder (VCR), cable television reception unit, satellite television reception unit, computer, and radio or the like.

Referring to FIG. 2, preferred remote control 10 includes conventional microcontroller 14 having an internal read-only-memory (ROM) containing programming for implementing the operation thereof in accordance with the present invention. Remote control 10 also includes a nonvolatile, random-access-memory (RAM) 16 as the preferred memory device, conventional battery power supply 18, conventional infrared (IR) output device 20 operable for sending coded IR control signals to television 12, and keypad 22. Microcontroller 14 is responsive to entries on keypad 22 according to the programming for storing data as needed in RAM 16 and for providing output signals by way of output device 20 to control television 12 including channel selection thereon.

FIG. 3 illustrates remote control 10 and keypad 22. As shown, keypad 22 includes conventional keys for channel UP and channel DOWN, PREVIOUS (previous channel), volume UP and volume DOWN, numerics (0 through 9), the ENTER function and ON/OFF. In accordance with the present invention, keypad 22 also includes additional keys for use in implementing the preferred method hereof in cooperation with the conventional keys. As discussed further herein, these additional keys include LOOP, ADD, DELETE, DISPLAY/EDIT, SELECT, MOVE, COPY, RESET and UNDO.

In order to set up a loop, the user presses LOOP, a numeric key corresponding to an unused loop designation such as "2" and then presses ENTER. Microcontroller 14 responds by storing loop data representative of the "loop 2" designation in RAM 16.

The user then selects those channels to be included in loop 2. This is accomplished by pressing ADD, the numeric key or keys corresponding to the channel number such as "4" and "8" as the channel designation for channel 48, and then ENTER. In response, microcontroller 14 stores channel data representative of the channel designation "48" in RAM 16 in association with the loop data for loop 2. This process is repeated to add additional channels such as the six channels (CH) of loop 2 illustrated on the screen of television 12 in FIG. 1. In this example, the six channels comprise a subset of all of the available channels which make up the primary set.

As an alternative, the channel UP and channel DOWN keys can be used to add channels to the loop. The user presses ADD then UP or DOWN to scroll through a plurality of channels and then presses ENTER. This adds all of those channels that were scrolled to the channel loop. As another technique, pressing ADD then ENTER adds the current channel to the loop.

With a loop defined such as loop 2, scrolling is enabled for the channel UP and DOWN keys only for those channels in the subset such as the six channels illustrated in FIG. 1. Thus, if the displayed channel is channel 48, pressing channel UP results in a scroll to the next channel in the subset which is channel 17 while skipping all of the channels inbetween. Continued activation of channel UP continues the scrolling through channels 74, 4, 32, 12, and back to 48 in a closed loop. Activation of the channel DOWN initiates the scrolling through these channels in reverse order. As this procedure indicates, the channels in a given subset can be arranged in any desired order, without regard to numerical sequence. The procedure for deleting channels is the same as that for adding a channel except for pressing the DELETE key.

The procedure described above is repeated to define other loops. After a loop is defined, pressing LOOP followed by numeric keys corresponding to the loop number activates this loop. That is, microcontroller 14 responds to these entries on keypad 22 and retrieves the corresponding loop data and associated channel data from RAM 16. Scrolling is enabled using channel UP and DOWN only for those channels in the subset represented by the channel data and scrolling skips those channels outside the subset.

The DISPLAY/EDIT key initiates the display and edit functions. Pressing DISPLAY/EDIT followed by LOOP and a channel number causes display of the loop information as illustrated in FIG. 1. Specifically, this initiates display of the loop number and the channels included in the subset for that loop. DISPLAY/EDIT also functions as an escape key to void changes made before the ENTER key is pressed.

The SELECT key is used after MOVE or COPY to mark the start and end of a group of channel numbers to be moved or copied. If otherwise pressed, the display is replaced by the current channel number highlighted by a cursor.

The MOVE key moves a selected channel number section to a new location within the current loop. This function is initiated by pressing MOVE, SELECT, and then channel UP or DOWN to scroll through a channel group to be moved. SELECT is pressed and then channel UP or DOWN to move to the location in the loop for insertion of this channel group. Pressing ENTER enters the channel group in the new location. This channel group can be moved to a different loop by pressing LOOP and the numerics for the loop number after the SELECT key.

The COPY function allows a group of channels to be copied to a new location in the same loop. The sequence is COPY, SELECT and channel UP or DOWN to scroll through the channel numbers to be copied. The user then presses SELECT and channel UP or DOWN to move to the loop location for insertion. Pressing ENTER copies the selected channels to the new location in the loop. The channel group can be copied to a different loop by pressing LOOP and the numerics for the loop number after SELECT.

RESET reloads the current loop with all available channel numbers in numerical order. This can be useful when completely redefining a given loop. UNDO can be pressed to negate a channel deletion when using the DELETE function if activated before any other key is pressed.

In the preferred embodiment, the capacity of RAM 16 is sufficient for storing loop data and channel data for ten loops corresponding to numeric keys 0–9. It is preferred that loop "0" is the default loop always containing all of the available channels. That is, with loop 0, the subset is coextensive with the primary set. With loop 0 as the designated loop, remote control 12 functions in the conventional mode allowing channel UP or DOWN to scroll through all of the available channels.

This leaves nine loops available for custom use. For example, each member of a household can have his or her own custom-defined loop with that person's favorite channels included in the associated subset. Also, loops can be defined for different types of channels. For example, one loop could include all of the sports channels and another could contain the movie channels while still another contains the commercial broadcast network channels.

Moreover, the ease of use of the ADD and DELETE functions allows a given loop to be revised on an ongoing basis. For example, for a sports channel loop, channels can be deleted as a sporting event ends and others added as sporting events begin on these other channels.

It will also be appreciated that the control functions can reside in the receiver rather than in the remote control. For example, the preferred control apparatus including microcontroller 14 and RAM 16 could be present in television 12 instead of remote control 10. Most televisions include signal processing and memory capabilities and the functions of the present invention could be readily and economically added. This would reduce the cost of the remote control.

Those skilled in the art will appreciate that the present invention encompasses many other variations in the preferred embodiment described herein. Having thus described this embodiment, the following is claimed as new and desired to be secured by Letters Patent:

What is claimed is:

1. A channel organizer apparatus for use with a receiver operable for receiving and presenting a plurality of channels as a primary set of channels and responsive to control signals from a remote control for selection of a channel, the remote control being operable for transmitting the control signals in response to entries on a keypad including channel up and channel down entries for scrolling through a plurality of channels on the receiver, said apparatus comprising:

a memory device; and a controller coupled with said memory device and including means responsive to entries on the keypad for storing loop data in said memory device representative of a designated scrolling loop in response to entry of a loop designation on the keypad of the remote control, and storing, in said memory device in association with said loop data, channel data representative of a subset of channels selected from said primary set in response to entry of channel designations on the keypad of the remote control, said controller including means for responding to entry of said loop designation by way of said keypad by retrieving said loop data and associated channel data from said memory device, and enabling scrolling on the receiver, in response to channel up and channel down entries on the keypad, only through those channels included in said subset and skipping those channels outside said subset, said controller further including means for responding to a reset entry on the keypad by including all of the channels in said primary set in said subset, said controller further including means for storing loop data and associated channel data for a plurality of said channel loops and associated subsets of channels.

2. A channel organizer apparatus for use with a receiver operable for receiving and presenting a plurality of channels as a primary set of channels and responsive to control signals from a remote control for selection of a channel, the remote control being operable for transmitting the control signals in response to entries on a keypad including channel up and channel down entries for scrolling through a plurality of channels on the receiver, said apparatus comprising:

a memory device; and a controller coupled with said memory device and including means responsive to entries on the keypad for storing loop data in said memory device representative of a designated scrolling loop in response to entry of a loop designation on the keypad of the remote control, and storing, in said memory device in association with said loop data, channel data representative of a subset of channels selected from said primary set in response to entry of channel designations on the keypad of the remote control, said controller including means for responding to entry of said loop designation by way of said keypad by retrieving said loop data and associated channel data from said memory device, and enabling scrolling on the receiver, in response to channel up and channel down entries on the keypad, only through those channels included in said subset and skipping those channels outside said subset, said controller further including means for responding to a delete entry on the keypad by deleting a selected channel from said subset, responding to an undo entry on the keypad by negating the response to said delete entry, responding to a move entry on the keypad by moving selected ones of the channels to one of a different scrolling location within said subset and a subset in a different scrolling loop, responding to a copy entry on the keypad by copying selected ones of the channel designations to one of a different scrolling location within said subset and a subset in a different scrolling loop, and responding to a reset entry on the keypad by including all of the channels in said primary set in said subset, said controller further including means for storing loop data and associated channel data for a plurality of said channel loops and associated subsets of channels.

\* \* \* \* \*